United States Patent
Lin et al.

(10) Patent No.: US 7,271,483 B2
(45) Date of Patent: Sep. 18, 2007

(54) BUMP STRUCTURE OF SEMICONDUCTOR PACKAGE AND METHOD FOR FABRICATING THE SAME

(75) Inventors: Ying-Ren Lin, Taichung (TW); Chien-Ping Huang, Hsinchu Hsein (TW); Ho-Yi Tsai, Taichung Hsien (TW); Cheng-Hsu Hsiao, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 281 days.

(21) Appl. No.: 11/026,919

(22) Filed: Dec. 29, 2004

(65) Prior Publication Data
US 2006/0051954 A1    Mar. 9, 2006

(30) Foreign Application Priority Data
Sep. 7, 2004    (TW) .............................. 93126956 A

(51) Int. Cl.
*H01L 23/52*    (2006.01)
*H01L 23/48*    (2006.01)
*H01L 23/40*    (2006.01)

(52) U.S. Cl. ............... 257/737; 257/780; 257/E23.021; 257/E21.508; 438/613

(58) Field of Classification Search ............... 257/737, 257/780, E23.021, E21.508; 438/613
See application file for complete search history.

(56) References Cited

U.S. PATENT DOCUMENTS

2005/0121804 A1 *    6/2005    Kuo et al. .................. 257/781

* cited by examiner

*Primary Examiner*—Asok Kumar Sarkar
(74) *Attorney, Agent, or Firm*—Peter F. Corless; Steven M. Jensen; Edwards Angell Palmer & Dodge LLP

(57) ABSTRACT

A bump structure of a semiconductor package and a method for fabricating the same are provided. The bump structure is used to connect a semiconductor element to a carrier of the semiconductor package. The fabrication method primarily employs an electroplating process to form the bump structure including an under bump metallurgy (UBM) layer, at least one I-shaped conductive pillar, and a solder material. This allows fine-pitch electrical connection pads to be arranged in the semiconductor package, and also provides an enhanced support structure and a sufficient height between the semiconductor element and the carrier.

18 Claims, 8 Drawing Sheets

BUMP STRUCTURE OF SEMICONDUCTOR PACKAGE AND METHOD FOR FABRICATING THE SAME

FIELD OF THE INVENTION

The present invention relates to bump structures of semiconductor packages and fabrication methods thereof, and more particularly, to a bump structure of a flip-chip semiconductor package, and a method for fabricating the bump structure.

BACKGROUND OF THE INVENTION

Along with the development of light-weight and small-profile electronic products, semiconductor packages serving as core components of the electronic products have accordingly been miniaturized in size. Preferably, the semiconductor packages with a reduced size, fine-pitch interconnections and high-density I/O (input/output) connections, such as a flip-chip package, ball grid array (BGA) package, and chip size package (CSP), etc., have become mainstream package products in the market.

For example, in a conventional flip-chip semiconductor package 10 shown in FIG. 1, a plurality of bumps 101 are formed on an active surface of a semiconductor element 103 such as a semiconductor chip or wafer, and corresponding electrical connection pads are disposed on a carrier 105 such as a substrate or circuit board. The semiconductor element 103 is mounted on the carrier 105 in a face-down manner that the active surface of the semiconductor element 103 faces downwardly and the bumps 101 are bonded to the electrical connection pads on the carrier 105, such that the semiconductor element 103 is electrically connected to the carrier 105 via the bumps 101, and signals from the semiconductor element 103 can be transmitted to the carrier 105.

In order to prevent short circuit caused by melting and bridging of the plurality of bumps 101 during a subsequent high-temperature reflow process, U.S. Pat. No. 6,038,136 has disclosed the use of an underfill material 107 such as resin for filling spaces between the adjacent bumps 101, so as to isolate the bumps 101 from each other and enhance the bonding strength between the bumps 101 and the carrier 105.

However, since the functionality of the semiconductor element has become more complicated, the bumps are accordingly arranged in higher density. As a result, a pitch between adjacent bumps has been reduced from 250 µm to 200 µm, or even to 150 µm. Particularly for the conventional ball-shaped bumps 101 shown in FIG. 1, the spaces between the adjacent bumps 101 would be too small to be completely filled with the underfill material 107 due to the bump shape, and thus causes voids being formed between the adjacent bumps 101. This adversely affects the reliability of the semiconductor package, and even leads to bridging or short circuit of the bumps 101 after the reflow process.

In light of the foregoing drawbacks, U.S. Pat. No. 5,698,465 or 6,555,296 has disclosed the use of pillar bumps to increase spacing between adjacent bumps and maintain a height between the semiconductor element and the carrier, so as to solve the above problem of incomplete filling of the underfill material in the small spaces between adjacent bumps. As shown in FIG. 2, for fabricating a bump structure disclosed in U.S. Pat. No. 5,698,465, an under bump metallurgy (UBM) layer 205 is firstly formed on a bond pad 207 of a semiconductor element such as a chip. Then, a specific pillar bump 201 is formed on the UBM layer 205, and a solder material 203 is applied on the pillar bump 201 by a printing or electroplating technique. Subsequently, the solder material 203 is subjected to a reflow process to electrically connect the pillar bump 201 to a corresponding electrical connection pad on a carrier.

The pillar bump 201 can desirably maintain the height between the semiconductor element and the carrier, however it has a limited effect on increasing the spacing between adjacent pillar bumps. Particularly when the number of I/O connections of the semiconductor element is increased and the pitch between adjacent pillar bumps is reduced to below about 150 µm, the similar drawback is produced that the underfill material fails to penetrate and fill small spaces between the adjacent pillar bumps, thereby causing the problem of voids or short circuit, etc.

Therefore, the problem to be solved here is to provide a bump structure of a semiconductor package, which can avoid the above drawbacks in the prior art.

SUMMARY OF THE INVENTION

In light of the drawbacks in the prior art, a primary objective of the present invention is to provide a bump structure of a semiconductor package and a method for fabricating the same, so as to increase spacing between adjacent bumps and reduce formation of voids.

Another objective of the invention is to provide a bump structure of a semiconductor package and a method for fabricating the same, so as to maintain a sufficient height between a semiconductor element and a carrier.

A further objective of the invention is to provide a bump structure of a semiconductor package and a method for fabricating the same, which can facilitate filling of an underfill material between adjacent bumps.

In order to achieve the foregoing and other objectives, the present invention proposes a bump structure of a semiconductor package, for connecting a semiconductor element to a carrier of the semiconductor package, wherein the semiconductor element has at least one electrical connection pad on a surface thereof. The bump structure comprises: an under bump metallurgy (UBM) layer formed on the electrical connection pad; an I-shaped conductive pillar disposed on the UBM layer, wherein a middle portion of the conductive pillar has a width smaller than that of an upper end and a lower end of the conductive pillar respectively; and a solder material applied on the conductive pillar.

A method for fabricating the foregoing bump structure of the semiconductor package, comprises the steps of: providing a carrier and a semiconductor element, wherein the semiconductor element has a plurality of electrical connection pads on a surface thereof; performing an under bump metallurgy (UBM) process to form a UBM layer on the electrical connection pads; performing an electroplating process to deposit a conductive pillar on a position of the UBM layer corresponding to each of the electrical connection pads, wherein a middle portion of the conductive pillar has a width smaller than that of an upper end and a lower end of the conductive pillar respectively; and applying a solder material on each of the conductive pillars.

The bump structure in the present invention is formed on the semiconductor element, or alternatively can be formed on the carrier. In the latter case, an active surface of the semiconductor element can be attached and electrically connected to the bump structure of the carrier.

The semiconductor element can be a semiconductor chip, and the carrier can be a substrate or circuit board. The conductive pillar is I-shaped, comprising a first conductive portion, a second conductive portion, and a third conductive portion, wherein the width of the first conductive portion and the third conductive portion is respectively larger than the width of the second conductive portion. The desirable I-shaped conductive pillar is fabricated by performing a series of exposure and development processes and controlling the size of photoresist openings during each of the exposure and development processes.

For example, a first photoresist layer can be firstly formed on the UBM layer and has a plurality of first openings for exposing positions of the UBM layer corresponding to the electrical connection pads. Then, an electroplating process is performed in each of the first openings to form a first conductive portion that is connected to the UBM layer. A second photoresist layer is applied on the first photoresist layer and has a plurality of second openings for exposing the first conductive portions, wherein the second opening is smaller in size than the first opening. Then, the electroplating process is performed in each of the second openings to form a second conductive portion that is connected to the corresponding first conductive portion. Subsequently, an electroless plating or sputtering process is carried out to deposit a thin metallic layer on the second photoresist layer and the second conductive portions. A third photoresist layer is applied on the thin metallic layer and has a plurality of third openings for exposing positions of the thin metallic layer corresponding to the second conductive portions, wherein the third opening is larger in size than the second opening. Afterwards, the electroplating process is performed in each of the third openings to form a third conductive portion that is connected to the thin metallic layer and the second conductive portion. Finally, a solder material is applied on each of the third conductive portions, such that a set of the first, second and third conductive portions form an I-shaped conductive pillar.

Since the first conductive portion and the third conductive portion of the I-shaped conductive pillar are wider than the second conductive portion, the I-shaped conductive pillar has an inwardly recessed structure. Thus, the I-shaped conductive pillar not only maintains a sufficient height between the semiconductor element and the carrier, but also provides wider spaces for filling an underfill material between adjacent conductive pillars, such that fine-pitch electrical connection pads can be arranged in the semiconductor package, and the problems in the prior art due to incomplete filling of the underfill material are solved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 3 to 5B are schematic diagrams showing a bump structure of a semiconductor package and a method for fabricating the bump structure according to preferred embodiments of the present invention. It should be noted that the drawings are simplified schematic diagrams and only show the basic structure and relevant components according to the present invention. The number, shape and size of the components are not drawn in real scale, and the arrangement of components should be much more complex in practice.

Figure 3:
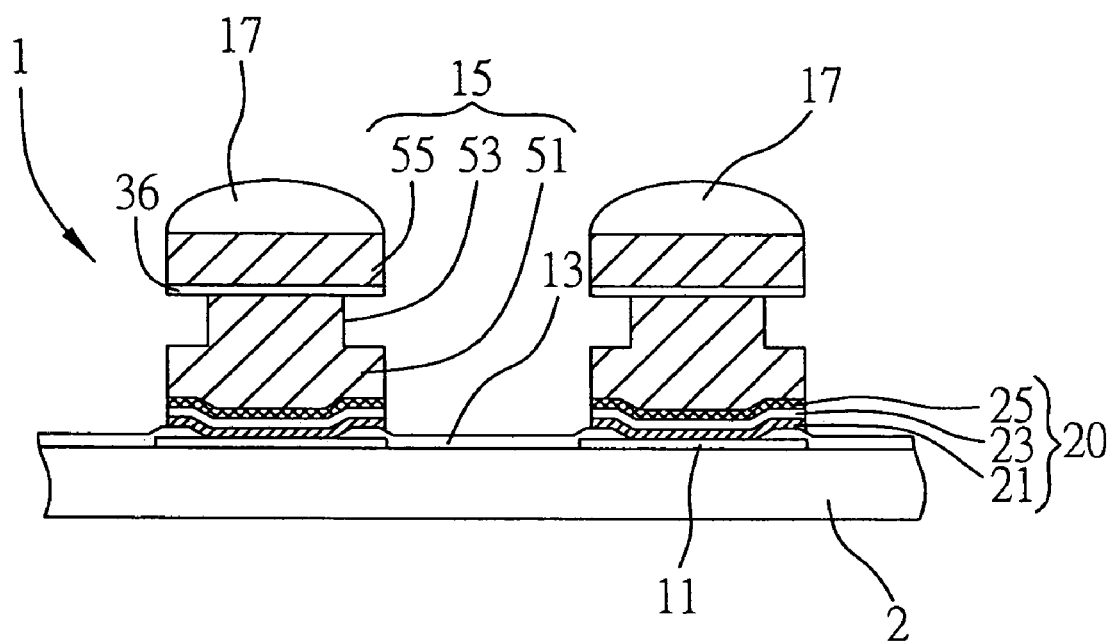
FIG. 3 is a cross-sectional view of a bump structure of a semiconductor package in accordance with the present invention.

FIG. 3 shows the bump structure 1 of a semiconductor package in this embodiment. The bump structure 1 is used for connecting a semiconductor element 2 to a carrier. The semiconductor element 2 has a plurality of electrical connection pads 11 and a passivation layer 13 thereon, with the electrical connection pads 11 being exposed from the passivation layer 13. The bump structure 1 comprises an under bump metallurgy (UBM) layer 20, an I-shaped conductive pillar 15, and a solder material 17.

In this embodiment, the electrical connection pads 11 are formed on a surface of the semiconductor element 2, and the passivation layer 13 is applied on the surface of the semiconductor element 2 and have openings 131 (shown in FIG. 4A) for exposing the electrical connection pads 11. The UBM layer 20 is formed on each of the exposed electrical connection pads 11. The passivation layer 13 can be made of a material such as silica, polyimide, silicon nitride, or any other equivalent material that is capable of preventing external air, water and dust from coming into contact with the surface of the semiconductor element 2.

The I-shaped conductive pillar 15 can be made of a metal such as, but not limited to, copper or lead. The I-shaped conductive pillar 15 is formed on an upper surface of the UBM layer 20 located on each of the electrical connection pads 11, wherein a middle portion of the I-shaped conductive pillar 15 has a width smaller than that of an upper end and a lower end of the conductive pillar 15 respectively, such that the conductive pillar 15 has an inwardly recessed structure and thus increases spacing between the adjacent conductive pillars 15. The solder material 17 is applied on the I-shaped conductive pillar 15 by a printing or electroplating technique and is then subjected to a reflow process. This completes the bump structure 1 in this embodiment.

In this embodiment, a single I-shaped conductive pillar 15 is formed on each of the electrical connection pads 11. It should be noted that the present invention is not limited to this arrangement. Alternatively, in the present invention, two or more I-shaped conductive pillars 15 can be vertically stacked to be mounted on a corresponding electrical connection pad 11.

The bump structure 1 can be fabricated by procedural steps shown in FIGS. 4A to 4L. The bump structure 1 is used to connect the semiconductor element to the carrier of the semiconductor package.

In this embodiment, the bump structure 1 is firstly formed on the semiconductor element 2 such as a semiconductor chip, and then the semiconductor element 2 is attached to the carrier such as a substrate or circuit board via the bump structure 1. It should be noted that the present invention is not limited to this arrangement. Alternatively, the bump structure 1 can be firstly formed on the carrier, and then the carrier with the bump structure 1 is connected to the semiconductor element 2.

Figure 4A:
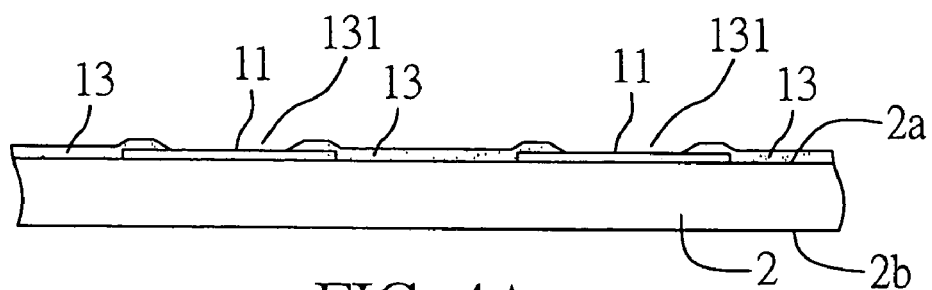
FIGS. 4A to 4L are schematic diagrams showing a method for fabricating the bump structure of the semiconductor package in accordance with the present invention.

First referring to FIG. 4A, the semiconductor element 2 such as a semiconductor chip is provided, which has an active surface 2a and a non-active surface 2b opposed to the active surface 2a. A plurality of electrical connection pads 11 made of copper or aluminum and a passivation layer 13 are formed on the active surface 2a of the semiconductor element 2. The passivation layer 13 has a plurality of openings 131 for exposing the electrical connection pads 11. In this embodiment, the passivation layer 13 can be applied by printing, spin-coating, attaching, or any other equivalent technique. The passivation layer 13 is then subjected to processes of photoresist formation, exposure and development, etc. so as to expose the electrical connection pads 11 from the passivation layer 13. There are numerous methods well known in the art for fabricating the electrical connection pads and passivation layer on the semiconductor element 2, which are not the characteristic feature of the present invention and not to be further detailed herein.

Figure 4B:
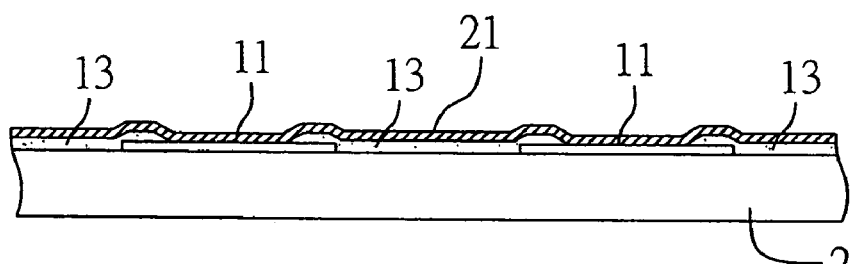
Figure 4C:
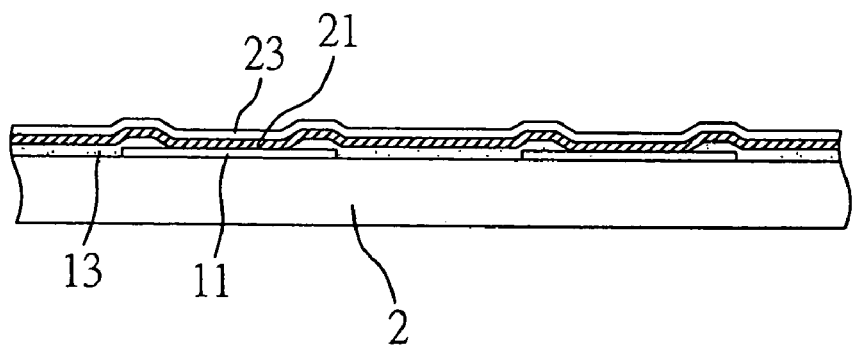

Next, a UBM layer 20 is formed on the electrical connection pads 11, which comprises a metallic adhesion layer 21, a barrier layer 23 and a solder wettable layer 25. Referring to FIG. 4B, the metallic adhesion layer 21 made of such as copper or titanium is deposited on the electrical connection pads 11 and the passivation layer 13 by an electroless plating, sputtering or evaporating technique. Then, referring to FIG. 4C, the barrier layer 23 made of nickel or nickel/vanadium alloy is deposited on the metallic adhesion layer 21 by a sputtering, evaporating or electroplating technique, etc.

Figure 4D:
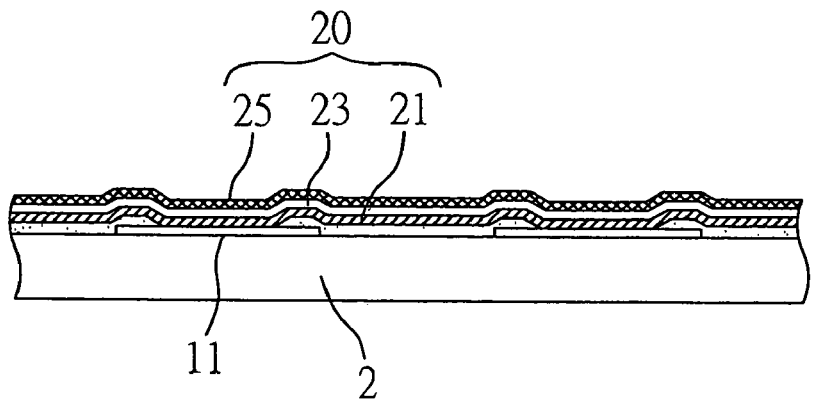

Referring to FIG. 4D, a solder wettable layer 25 made of e.g. copper is deposited on the barrier layer 23 by a sputtering technique. The metallic adhesion layer 21, the barrier layer 23 and the solder wettable layer 25 together form the foregoing UBM layer 20.

Figure 4E:
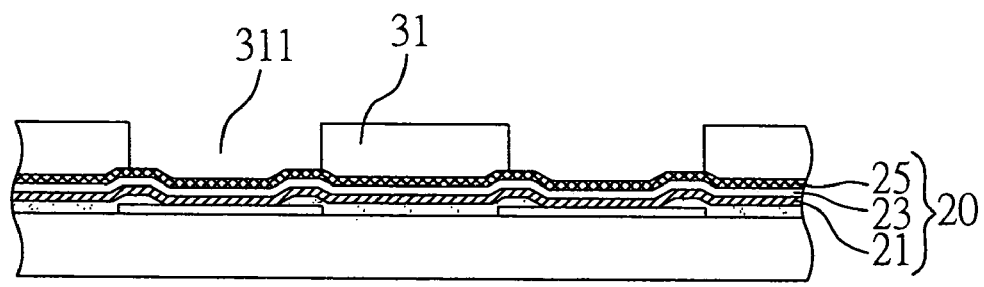

Subsequently, referring to FIG. 4E, a first photoresist layer 31 such as a dry film or liquid photoresist is applied on the topmost solder wettable layer 25 and then subjected to exposure, lithography and etching processes, such that positions of the solder wettable layer 25 corresponding to the electrical connection pads 11 are exposed via first openings 311 formed in the first photoresist layer 31.

Figure 4F:
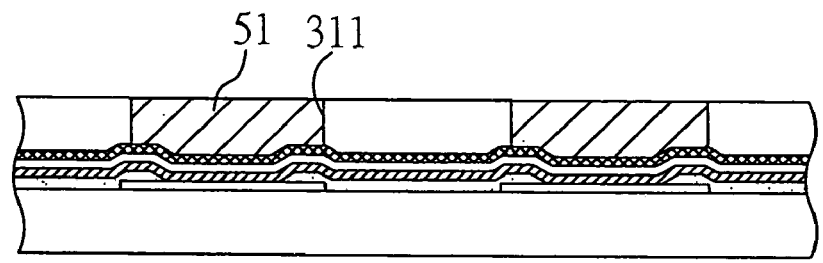

Referring to FIG. 4F, an electroplating process is carried out to form a first conductive portion 51 in each of the first openings 311. In this embodiment, as shown in FIG. 4F, a top surface of the first conductive portion 51 is flush with that of the first photoresist layer 31; however, the present invention is not limited to such arrangement.

Figure 4G:
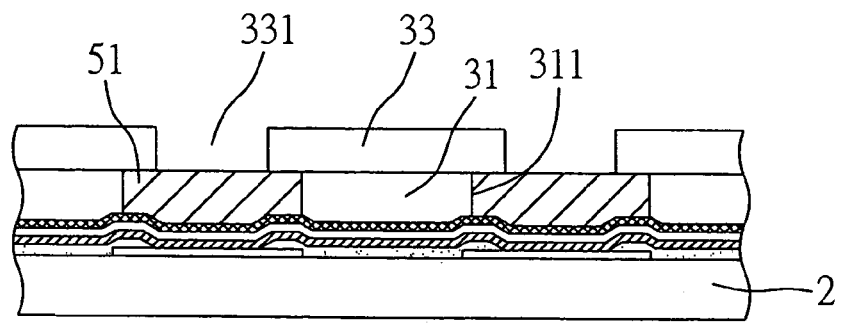

Referring to FIG. 4G, a second photoresist layer 33 is applied on the first photoresist layer 31, and has a plurality of second openings 331 for partly exposing the first conductive portions 51, wherein the size of the second opening 331 is smaller than that of the first opening 311. Then, referring to FIG. 4H, the electroplating process is performed on the semiconductor element 2 to form a second conductive portion 53 in each of the second openings 331, wherein the second conductive portion 53 is connected to the corresponding first conductive portion 51 and has a width smaller than that of the first conductive portion 51.

Figure 1:
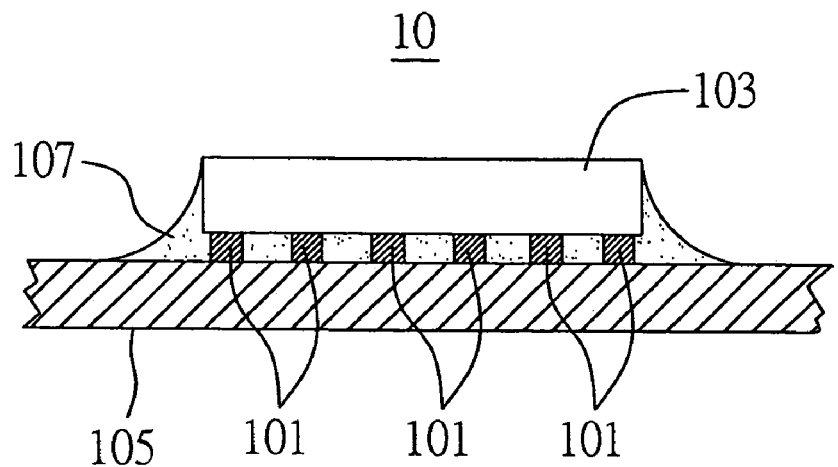
FIG. 1 (PRIOR ART) is a cross-sectional view of a conventional bump structure.
Figure 2:
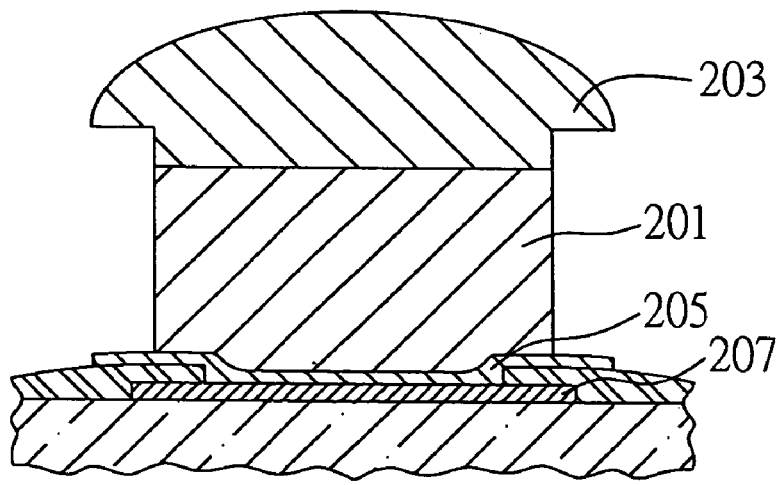
FIG. 2 (PRIOR ART) is a cross-sectional view of another conventional bump structure.
Figure 4H:
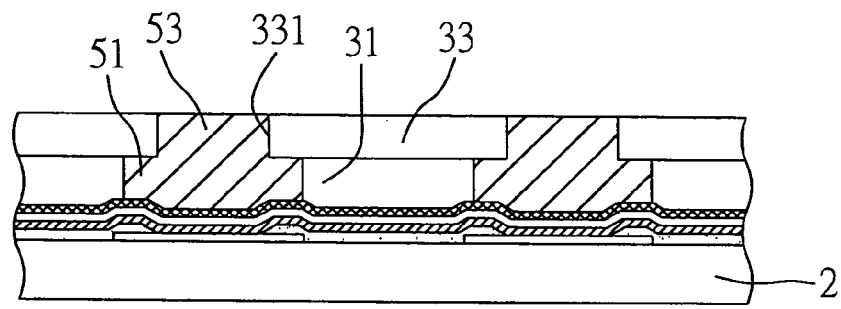
Figures 1, 4H:
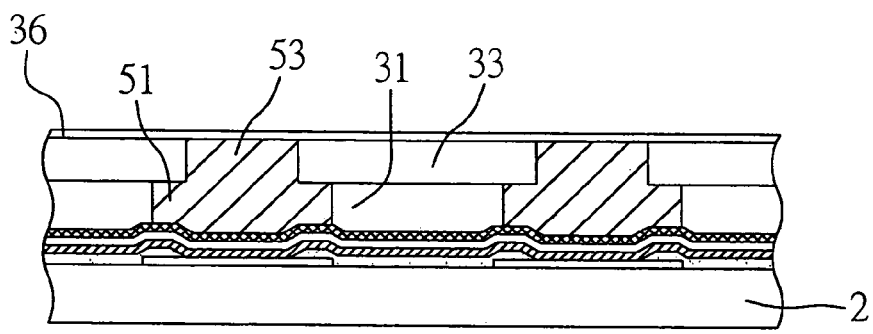

Moreover, referring to FIG. 4H-1, an electroless plating or sputtering process is performed to deposit a thin metallic layer 36 on the second photoresist layer 33 and the second conductive portions 53. This thin metallic layer 36 can be made of such as copper or palladium.

Figure 4I:
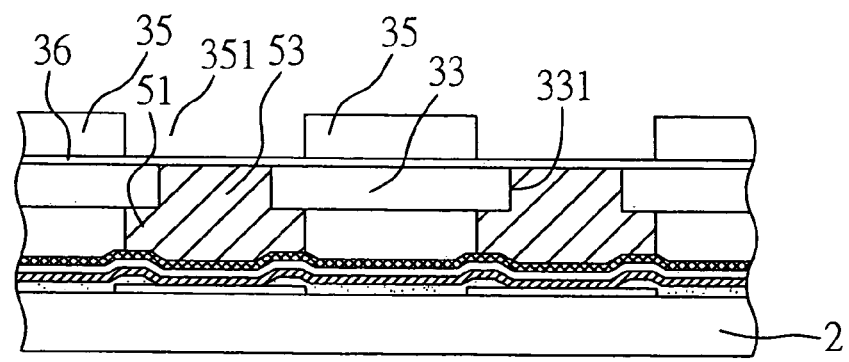

Referring to FIG. 4I, a third photoresist layer 35 is applied on the thin metallic layer 36, and has a plurality of third openings 351 for partly exposing the thin metallic layer 36, wherein the size of the third opening 351 is larger than that of the second opening 331.

Figure 4J:
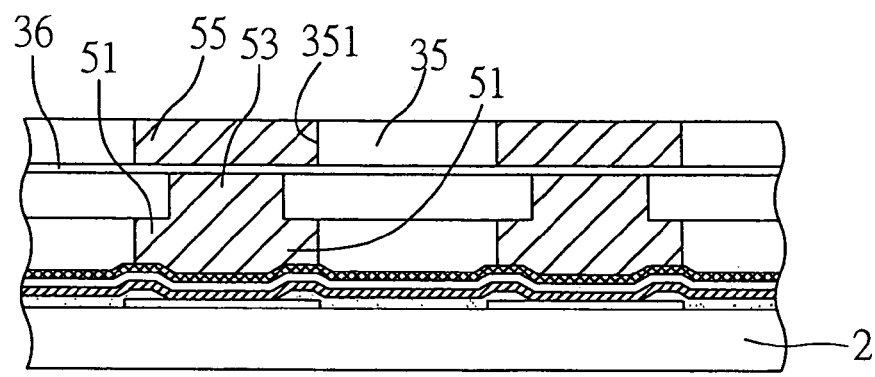

Referring to FIG. 4J, the electroplating process is carried out on the semiconductor element 2 to form a third conductive portion 55 in each of the third openings 351. This third conductive portion 55 is connected to the thin metallic layer 36 and the corresponding second conductive portion 53. Moreover, the first conductive portion 51, the second conductive 53, and the third conductive portion 55 can be made of a metal such as, but not limited to, copper, lead, tin, gold, zinc, or nickel, etc.

Figure 4K:
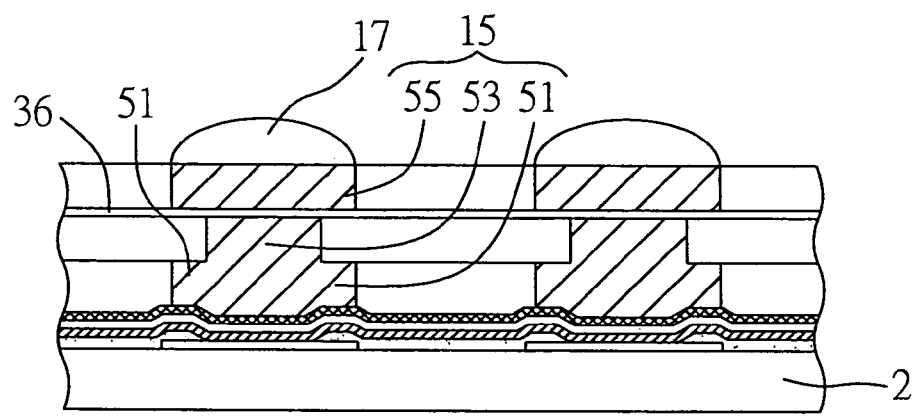

Subsequently, referring to FIG. 4K, a solder material 17 is formed on the third conductive portion 55 in each of the third openings 351 by a screen-printing or electroplating technique, etc. The solder material 17 can be an alloy made of a mixture of metals selected from the group consisting of lead, tin, silver and copper.

Figure 4L:
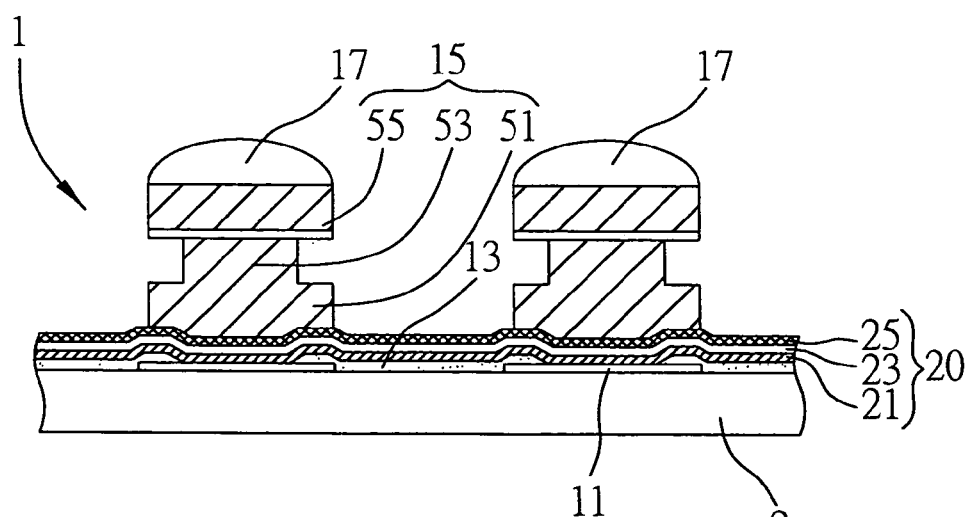

Finally, the semiconductor element 2 is subjected to exposure, development and etching processes to remove all the photoresist layers 31, 33, 35 and the thin metallic layer 36, as shown in FIG. 4L. Thus, a corresponding set of the first conductive portion 51, the second conductive portion 53 and the third conductive portion 55 completely forms an I-shaped conductive pillar 15 on each of the electrical connection pads 11, and a reflow process is performed to fix the solder material 17 on the I-shaped conductive pillar 15.

The removal of the first, second and third photoresist layers 31, 33, 35 and the thin metallic layer 36 employs a conventional technique well known in the art, which is not to be further described herein. Similarly, the processes of applying photoresist, exposure, lithography, etching, screen-printing and electroplating are all well known in the art and thus not to be further detailed herein.

Figure 5A:
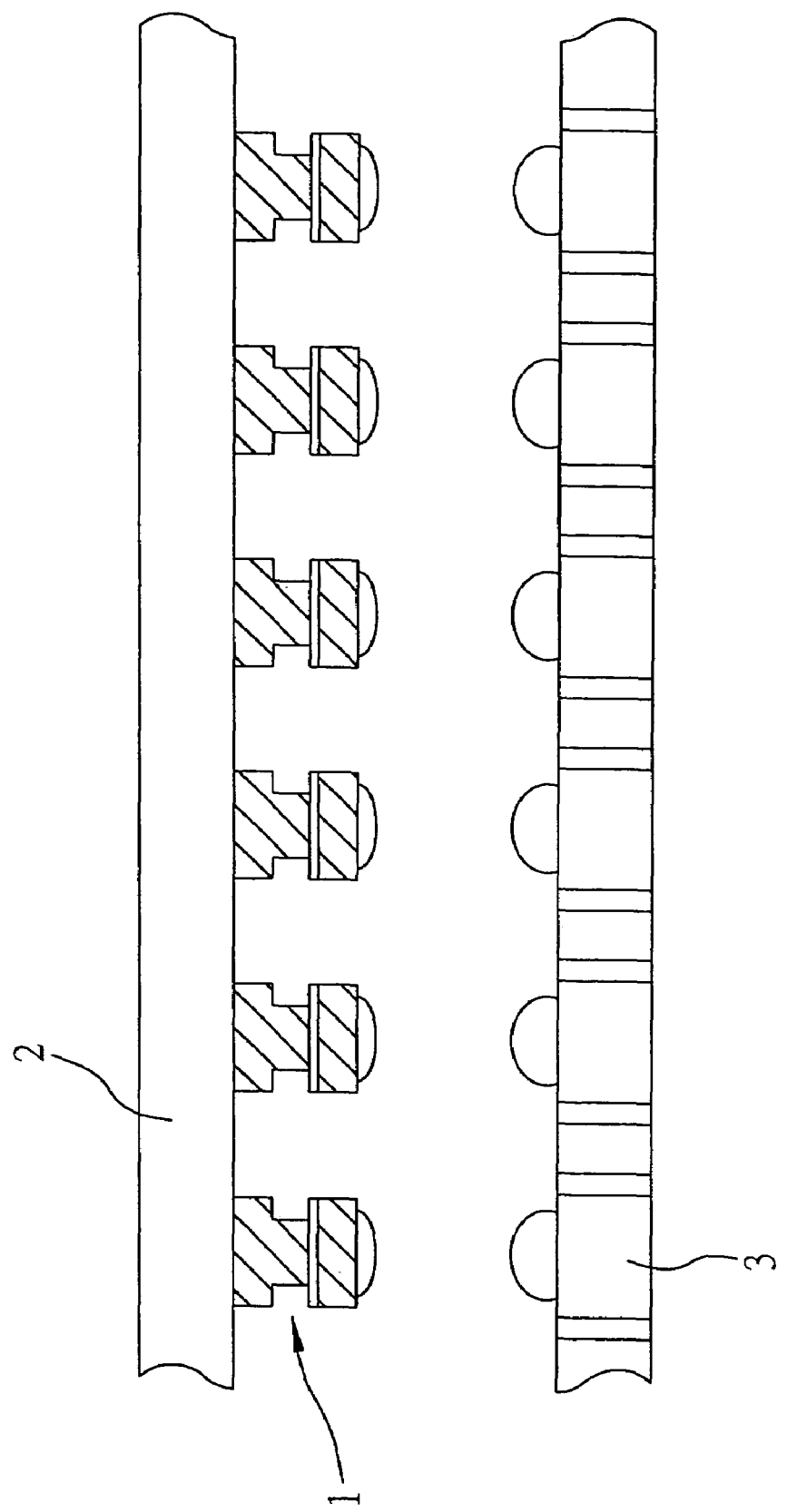
FIG. 5A is a schematic diagram showing the bump structure being formed on a semiconductor element to be connected to a carrier in accordance with the present invention.
Figure 5B:
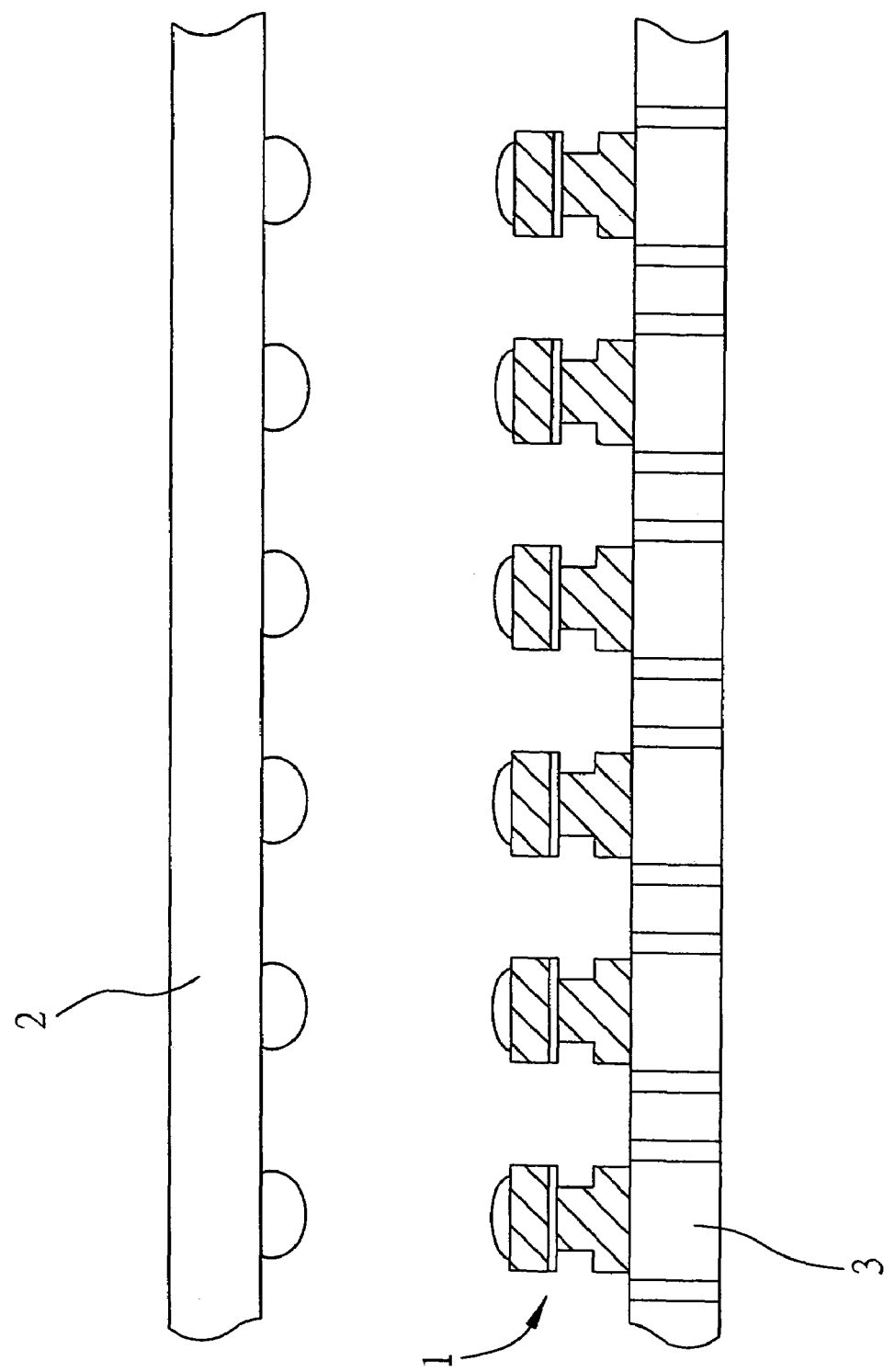
FIG. 5B is a schematic diagram showing the bump structure being formed on the carrier to be connected to the semiconductor element in accordance with the present invention.

In this embodiment, as shown in FIG. 5A, the bump structure 1 is formed on the semiconductor element 2 such as a semiconductor chip, and then this semiconductor element 2 with the bump structure 1 is connected to the carrier 3. Alternatively, in another preferred embodiment, as shown in FIG. 5B, the bump structure 1 can be formed on the carrier 3 such as a substrate or circuit board, and then this carrier 3 with the bump structure 1 is connected to the semiconductor element 2.

The I-shaped conductive pillar 15 comprises the first conductive portion 51, the second conductive portion 53 and the third conductive portion 55, and has a larger height than that of the conventional bump structure, such that the I-shaped conductive pillar 15 can provide a sufficient height between the semiconductor element and the carrier. Since the second conductive portion 53 has a width smaller than that of the first conductive portion 51 and the third conductive portion 53 respectively, the I-shaped conductive pillar 15 has an inwardly recessed structure and thus increases spacing between the adjacent conductive pillars 15 for accommodating an underfill material. As a result, when the underfill material is filled in spaces between the adjacent bump structures 1 during an underfill process, it is less likely to form voids in the spaces and the underfill process would not be affected by fine-pitch arrangement of electrical connection pads.

The drawings of the present invention only show a part of the electrical connection pads. It should be understood that the number of electrical connection pads and bump structures can be flexibly arranged in the semiconductor package according to the practical requirements. Further, the UBM layer can be formed over a surface of the semiconductor element or carrier having the electrical connection pads, or alternatively, the UBM layer can be individually formed on each of the electrical connection pads. Moreover, the fabrication processes of the bump structure can be applied to one side or both sides of the semiconductor element or carrier, and the present invention is not limited by the above embodiments.

Therefore, in the bump structure of a semiconductor package and the method for fabricating the bump structure according to the present invention, the I-shaped conductive pillar is formed by electroplating through the use of multiple photoresist layers and different openings of the photoresist layers, such that the fabricated I-shaped conductive pillar can have an inwardly recessed structure for increasing spacing between the adjacent bump structures to facilitate filling of the underfill material. This solves the prior-art problem of voids being formed between the fine-pitch bumps due to incomplete filling of the underfill material.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A bump structure of a semiconductor package, for connecting a semiconductor element to a carrier of the semiconductor package, the semiconductor element having at least one electrical connection pad on a surface thereof, the bump structure comprising:
    an under bump metallurgy (UBM) layer formed on the electrical connection pad;
    a conductive pillar formed on the UBM layer, wherein a middle portion of the conductive pillar has a width smaller than that of an upper end and a lower end of the conductive pillar respectively; and
    a solder material applied on the conductive pillar.

2. The bump structure of claim 1, wherein the semiconductor element is a semiconductor chip.

3. The bump structure of claim 1, wherein the semiconductor element further comprises a passivation layer formed on the surface thereof, with the electrical connection pad being exposed from the passivation layer.

4. The bump structure of claim 1, wherein the conductive pillar is an I-shaped conductive pillar.

5. The bump structure of claim 4, wherein the I-shaped conductive pillar comprises a first conductive portion, a second conductive portion, and a third conductive portion.

6. The bump structure of claim 5, wherein the first conductive portion and the third conductive portion have a width respectively larger than that of the second conductive portion.

7. A method for fabricating a bump structure of a semiconductor package, the bump structure for connecting a semiconductor element to a carrier of the semiconductor package, the method comprising the steps of:
    preparing the semiconductor element and the carrier, wherein a plurality of electrical connection pads are formed on a surface of the semiconductor element;
    performing an under bump metallurgy (UBM) process to form a UBM layer on the electrical connection pads;
    performing an electroplating process to form a conductive pillar on a position of the UBM layer corresponding to each of the electrical connection pads, wherein a middle portion of the conductive pillar has a width smaller than that of an upper end and a lower end of the conductive pillar respectively; and
    applying a solder material on each of the conductive pillars.

8. The method of claim 7, wherein the semiconductor element is a semiconductor chip.

9. The method of claim 7, wherein the semiconductor element further comprises a passivation layer formed on the surface thereof, with the electrical connection pads being exposed from the passivation layer.

10. The method of claim 7, wherein the conductive pillar is an I-shaped conductive pillar.

11. The method of claim 10, wherein the I-shaped conductive pillar comprises a first conductive portion, a second conductive portion, and a third conductive portion.

12. The method of claim 11, wherein the first conductive portion and the third conductive portion have a width respectively larger than that of the second conductive portion.

13. The method of claim 7, wherein the UBM process for forming the UBM layer comprises the steps of:
    forming at least one metallic adhesion layer on the electrical connection pads;
    forming at least one barrier layer on the metallic adhesion layer; and
    forming at least one solder wettable layer on the barrier layer.

14. The method of claim 7, wherein the conductive pillar and the solder material are formed via electroplating by the steps of:
    forming a first photoresist layer on the UBM layer, wherein the first photoresist layer has a plurality of first openings for exposing positions of the UBM layer corresponding to the electrical connection pads;
    depositing a first conductive portion via electroplating in each of the first openings, the first conductive portion being connected to the UBM layer;
    forming a second photoresist layer on the first photoresist layer, wherein the second photoresist layer has a plurality of second openings for exposing the first conductive portions;
    depositing a second conductive portion via electroplating in each of the second openings, the second conductive portion being connected to the corresponding first conductive portion;
    forming a thin metallic layer on the second photoresist layer and the second conductive portions via electroless plating or sputtering;
    forming a third photoresist layer on the thin metallic layer, wherein the third photoresist layer has a plurality of third openings for exposing positions of the thin metallic layer corresponding to the second conductive portions;
    depositing a third conductive portion via electroplating in each of the third openings, the third conductive portion being connected to the thin metallic layer and the corresponding second conductive portion; and
    forming the solder material on each of the third conductive portions.

15. The method of claim 14, wherein the second opening is smaller in size than the first opening.

16. The method of claim 14, wherein the third opening is larger in size than the second opening.

17. The method of claim 7, wherein the conductive pillar is made of a material selected from the group consisting of lead, tin, copper, gold, zinc and nickel.

18. The method of claim 7, wherein the solder material is an alloy made of a mixture of metals selected from the group consisting of lead, tin, silver and copper.

* * * * *